United States Patent
Takeo et al.

(10) Patent No.: US 8,929,031 B2
(45) Date of Patent: Jan. 6, 2015

(54) SPIN TORQUE OSCILLATOR, METHOD OF MANUFACTURING THE SAME, MAGNETIC RECORDING HEAD, MAGNETIC HEAD ASSEMBLY, AND MAGNETIC RECORDING APPARATUS

(75) Inventors: Akihiko Takeo, Kunitachi (JP); Satoshi Shirotori, Yokohama (JP); Kenichiro Yamada, Tokyo (JP); Katsuhiko Koui, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 13/291,777

(22) Filed: Nov. 8, 2011

(65) Prior Publication Data
US 2012/0140354 A1    Jun. 7, 2012

(30) Foreign Application Priority Data
Dec. 3, 2010   (JP) ................. 2010-270706

(51) Int. Cl.
  G11B 5/127   (2006.01)
  G11B 5/31   (2006.01)
  H01F 10/32   (2006.01)
  H01F 41/30   (2006.01)
  H01L 43/08   (2006.01)
  G11B 5/00   (2006.01)

(52) U.S. Cl.
  CPC ............ *G11B 5/3163* (2013.01); *G11B 5/1278* (2013.01); *G11B 5/314* (2013.01); *H01F 10/325* (2013.01); *H01F 41/308* (2013.01); *H01L 43/08* (2013.01); *G11B 2005/0024* (2013.01); *H01F 10/329* (2013.01)
  USPC ..................................................... 360/125.3

(58) Field of Classification Search
  USPC .............. 360/110, 125.3, 125.31, 125.71, 360/125.74, 128
  See application file for complete search history.

(56) References Cited

U.S. PATENT DOCUMENTS

| 7,760,472 B2 * | 7/2010 | Sato et al. ...................... 360/324 |
| 2005/0023938 A1 * | 2/2005 | Sato et al. ...................... 310/363 |
| 2008/0129401 A1 * | 6/2008 | Fukuzawa et al. ............ 331/157 |
| 2009/0052095 A1 * | 2/2009 | Yamada et al. ............... 360/324 |

(Continued)

FOREIGN PATENT DOCUMENTS

| JP | 2003-152241 | 5/2003 |
| JP | 2003-204094 | 7/2003 |

(Continued)

OTHER PUBLICATIONS

Jian-Gang (Jimmy) Zhu and Xiaochun Zhu, "Microwave Assisted Magnetic Recording (MAMR)", The Magnetic Recording Conference B6 (2007), pp. 34-35.

(Continued)

*Primary Examiner* — Adam B Dravininkas
(74) *Attorney, Agent, or Firm* — Patterson & Sheridan, LLP

(57) ABSTRACT

According to one embodiment, there is provided a spin torque oscillator including an oscillation layer formed of a magnetic material, a spin injection layer formed of a magnetic material and configured to inject a spin into the oscillation layer, and a current confinement layer including an insulating portion formed of an oxide or a nitride and a conductive portion formed of a nonmagnetic metal and penetrating the insulating portion in a direction of stacking. The conductive portion of the current confinement layer is positioned near a central portion of a plane of a device region including the oscillation layer and the spin injection layer.

9 Claims, 7 Drawing Sheets

(56) References Cited

U.S. PATENT DOCUMENTS

| | | | |
|---|---|---|---|
| 2009/0080109 A1* | 3/2009 | Fukuzawa et al. | 360/122 |
| 2009/0201614 A1* | 8/2009 | Kudo et al. | 360/324.11 |
| 2009/0310244 A1* | 12/2009 | Shimazawa et al. | 360/75 |
| 2012/0162823 A1* | 6/2012 | Ikai et al. | 360/234.3 |
| 2012/0176702 A1* | 7/2012 | Yamada et al. | 360/244 |

FOREIGN PATENT DOCUMENTS

| | | |
|---|---|---|
| JP | 2004095110 A | 3/2004 |
| JP | 2006-114099 | 4/2006 |
| JP | 2006-261306 | 9/2006 |
| JP | 2006295908 A | 10/2006 |
| JP | 2008053915 A | 3/2008 |
| JP | 2008084482 A | 4/2008 |
| JP | 2009194906 A | 8/2009 |
| JP | 2010-003351 | 1/2010 |
| WO | 2010053187 A1 | 5/2010 |

OTHER PUBLICATIONS

T. Takahashi, et al., "Effects of Current Path Confinement on Oscillating Behaviors of MAMR (micro assisted magnetic recording)", Digest of Treatises Reported in the 34$^{th}$ Annual Conference on Magnetics in Japan, 2010, p. 7 (with English translation).

Japanese Office Action dated Jun. 19, 2012, filed in Japanese counterpart Application No. 2010-270706, 8 pages.

* cited by examiner

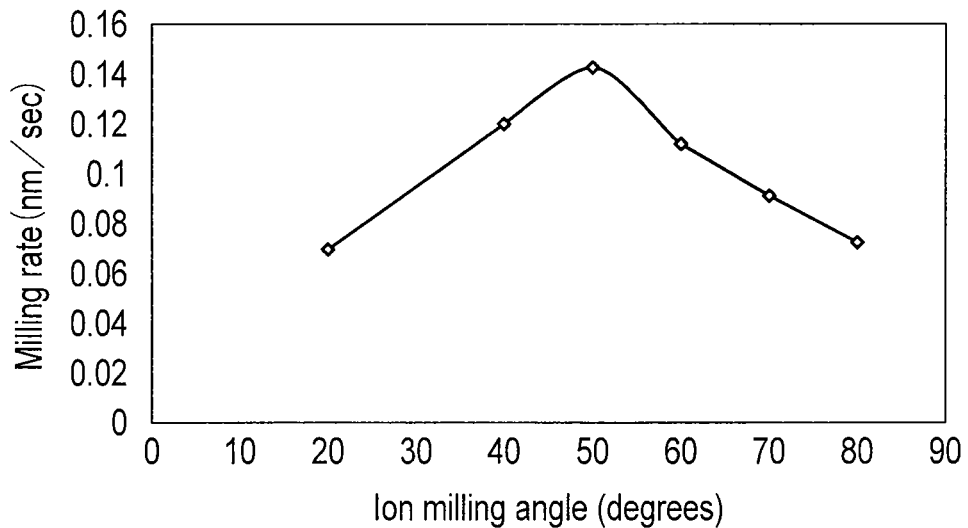
F I G. 6
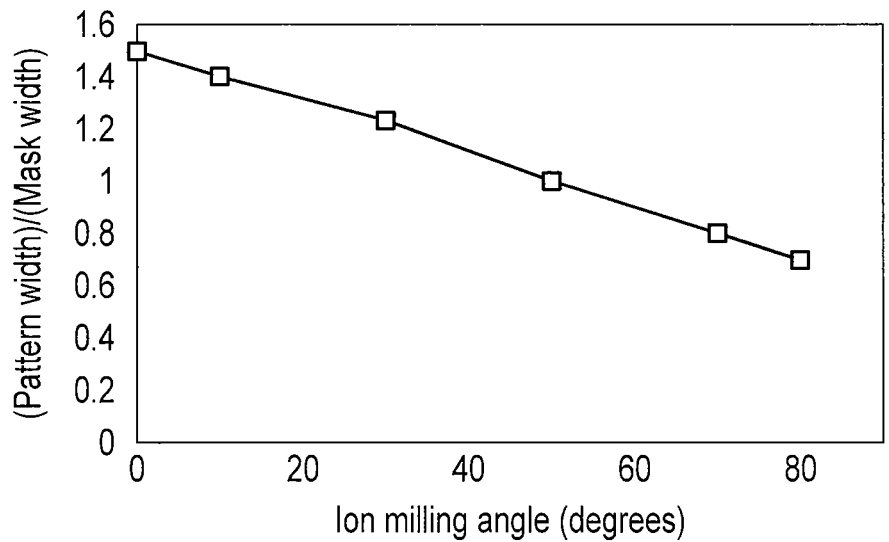
F I G. 7

SPIN TORQUE OSCILLATOR, METHOD OF MANUFACTURING THE SAME, MAGNETIC RECORDING HEAD, MAGNETIC HEAD ASSEMBLY, AND MAGNETIC RECORDING APPARATUS

CROSS-REFERENCE TO RELATED APPLICATIONS

This application is based upon and claims the benefit of priority from Japanese Patent Application No. 2010-270706, filed Dec. 3, 2010; the entire contents of which are incorporated herein by reference.

FIELD

Embodiments described herein relate generally to a spin torque oscillator, a method of manufacturing the same, a magnetic recording head, a magnetic head assembly, and a magnetic recording apparatus.

BACKGROUND

The recording density of magnetic recording apparatuses is expected to reach 1 Tbits/inch$^2$ in the future as a result of development of magnetic head techniques and perpendicular magnetic recording schemes. However, even with the perpendicular magnetic recording scheme adopted, achieving such a high recording density is not easy because of a thermal fluctuation problem.

A high-frequency field assisted recording scheme has been proposed in order to solve the thermal fluctuation problem. In the high-frequency field assisted recording scheme, a magnetic recording medium is locally subjected to an electric field of a high-frequency which is sufficiently higher than a recording signal frequency and which is close to the resonant frequency of the magnetic recording medium. As a result, the magnetic recording medium with the high-frequency field applied thereto resonates to reduce the coercivity (Hc) of the magnetic recording medium to half of the original value. When the high-frequency field is thus superimposed on the recording field, magnetic recording can be carried out on a magnetic recording medium with a coercivity (Hc) and magnetic anisotropic energy (Ku) which are higher than those in the conventional one.

The use of a spin torque oscillator for generation of a high-frequency electric field has been proposed. The spin torque oscillator comprises two magnetic layers, a spin injection layer and an oscillation layer. When a direct current is conducted through the spin torque oscillator via an electrode, the spin injection layer generates spin torque to subject magnetization in the oscillation layer to ferromagnetic resonance. As a result, the spin torque oscillator generates a high-frequency field. The spin torque oscillator is about several tens of nanometers in size. Thus, the high-frequency electric field generated is localized at a short distance of several tens of nanometers from the spin torque oscillator. Moreover, an in-plane component of the high-frequency electric field allows the perpendicularly magnetized magnetic recording medium to resonate efficiently. This enables a significant reduction in the coercivity of the magnetic recording medium. As a result, magnetic recording is carried out only in portions of the magnetic recording medium in which the recording field provided by a main pole is superimposed on the high-frequency field provided by the spin torque oscillator. This allows the use of a magnetic recording medium that is high in coercivity (Hc) and magnetic anisotropic energy (Ku). Hence, the thermal fluctuation problem, which may occur during high density printing, can be avoided.

To provide a high-frequency field assisted recording head, it is important to design and produce a spin torque oscillator which can oscillate stably at a low current density and which can generate an in-plane high-frequency field allowing the medium magnetization to sufficiently resonate.

That is, when a current of an excessively high density is conducted through the spin torque oscillator, heat generation and migration occur to degrade the characteristics of the spin torque oscillator. Thus, the maximum conductive current density is limited. Hence, it is important to design a spin torque oscillator that can oscillate at as low a current density as possible.

On the other hand, to allow the medium magnetization to sufficiently resonate, the intensity of the in-plane high-frequency field is desirably set to at least a certain level compared to the intensity of an anisotropy field (Hk) in the medium. A possible method for increasing the intensity of the in-plane high-frequency field is to increase one of saturation magnetization in the oscillation layer, the thickness of the oscillation layer, and the rotation angle of the magnetization in the oscillation layer. However, all of these methods serve to increase the current density.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 6 is a diagram illustrating the dependence of the milling rate of carbon on an ion milling angle;

FIG. 7 is a diagram illustrating the dependence, on the ion milling angle, of the ratio of pattern width to mask width obtained after ion milling;

DETAILED DESCRIPTION

Various embodiments will be described hereinafter with reference to the accompanying drawings.

In general, according to one embodiment, there is provided a spin torque oscillator including an oscillation layer formed of a magnetic material, a spin injection layer formed of a magnetic material and configured to inject a spin into the oscillation layer, and a current confinement layer including an insulating portion formed of an oxide or a nitride and a conductive portion formed of a nonmagnetic metal and penetrating the insulating portion in a direction of stacking. The conductive portion of the current confinement layer is positioned near a central portion of a plane of a device region including the oscillation layer and the spin injection layer.

Figure 1:
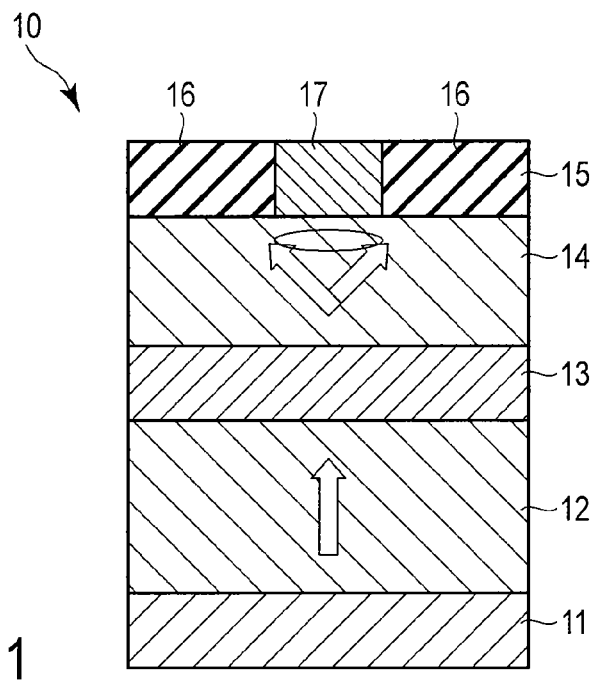
FIG. 1 is a cross-sectional view of a spin torque oscillator according to an embodiment.

FIG. 1 is a cross-sectional view of a spin torque oscillator according to the embodiment. A spin torque oscillator 10 shown in FIG. 1 is structured so that an underlayer 11, a spin injection layer 12, an intermediate layer 13, an oscillation layer 14, and a current confinement layer 15 are stacked in this order. The current confinement layer 15 includes an insulating layer 16 comprising an oxide or a nitride and a conductive portion 17 comprising a nonmagnetic metal and penetrating the insulating portion 16 in the direction of stacking.

The underlayer 11 functions to control the crystal orientation of the spin injection layer 12 but need not necessarily be provided. On the other hand, a protect layer may be provided between the oscillation layer 14 and the current confinement layer 15 as required in order to protect the oscillation layer 14 from damage caused by oxidation.

The spin torque oscillator 10 may include a pair of electrodes configured to allow a drive current to conduct through the direction of stacking of the stacked film. However, the electrodes may be a main electrode or shield (or return pole) of a magnetic head. In this case, at least one of the electrodes of the spin torque oscillator may be omitted. Furthermore, the spin torque oscillator may be provided on a trailing side or a leading side of the main pole. In the following description, the spin torque oscillator includes a pair of electrodes. An external field Hex is applied to the spin torque oscillator. A gap field generated between the electrodes causes an external field perpendicular to a film surface to be applied to the spin torque oscillator. The magnetization in the oscillation layer causes precession around an axis which is almost perpendicular to the film surface and which serves as the axis of rotation. Thus, high-frequency field is externally generated.

An FeCoAl alloy having in-plane magnetic anisotropy can be used as the oscillation layer. Alternatively, the oscillation layer may be formed of a material comprising an FeCoAl alloy to which at least one element selected from a group consisting of Si, Ge, Mn, Cr, and B is added. This allows adjustment of, for example, the saturation magnetic flux density (Bs), anisotropy field (Hk), and spin torque transmissivity of the oscillation layer and the spin injection layer.

A material with a high spin transmittance, for example, Cu, Au, or Ag may be used as the intermediate layer. The thickness of the intermediate layer desirably ranges from the thickness of one atom layer to 3 nm. The use of such an intermediate layer allows exchange coupling between the oscillation layer and the spin injection layer to be adjusted to an optimum value.

The spin injection layer may be appropriately formed of a material excellent in perpendicular orientation, for example, a CoCr-based magnetic layer such as CoCrPt, CoCrTa, CoCrTaPt, or CoCrTaNb in which magnetization is oriented perpendicularly to the film surface, an RE-TM-based amorphous alloy magnetic layer such as TbFeCo, a Co artificial-lattice magnetic layer such as Co/Pd, Co/Pt, or CoCrTa/Pd, a CoPt- or FePt-based alloy magnetic layer, or an SmCo-based alloy magnetic layer; a soft magnetic layer such as CoFe, CoNiFe, NiFe, CoZrNb, FeN, FeSi, or FeAlSi which has a relatively high saturation magnetic density and which is magnetically anisotropic in an in-plane direction; a Heusler alloy selected from a group consisting of CoFeSi, CoMnSi, and CoMnAl; or a CoCr-based magnetic alloy film in which magnetization is oriented in the in-plane direction. A plurality of materials selected from the above-described groups may be used in a stack for the spin injection layer.

A nonmagnetic metal material that is low in electric resistance, such as Ti, Cu, Ru, or Ta, may be used as the underlayer and the protect layer.

The current confinement layer includes the conductive portion comprising a nonmagnetic material such as Ti, Cu, Ru, or Ta which is low in electric resistance and the insulating portion comprising an oxide such as $SiO_2$ or $Al_2O_3$, a nitride such as SiN, or an oxide or a nitride of the nonmagnetic metal forming the conductive portion. A current path can be controlled by controlling the arrangement of the conductive portion and insulating portion of the current confinement layer.

FIGS. 2A to 2D show examples of arrangement of the conductive portion and insulating portion of the current confinement layer with respect to a device region including the oscillation layer and the spin injection layer. The device region including the oscillation layer and the spin injection layer has a rectangular planar shape. The conductive portion of the current confinement layer has a rectangular planar shape. The arrangements shown in FIGS. 2A to 2D are different from one another in the number of those of the four sides of the rectangular conductive portion for which the insulating portion is arranged between each of these sides of the conductive portion and a corresponding one of the four sides of the device region.

Figure 2A:
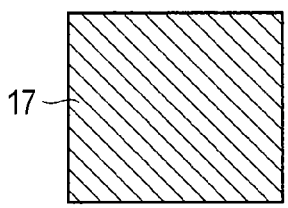
FIGS. 2A, 2B, 2C and 2D are plan views showing examples of arrangement of a conductive portion and an insulating portion of a current confinement layer with respect to a device region.
Figure 2B:
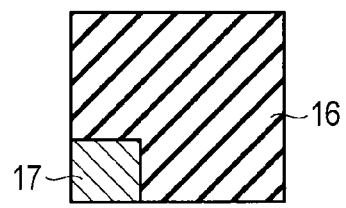
Figure 2C:
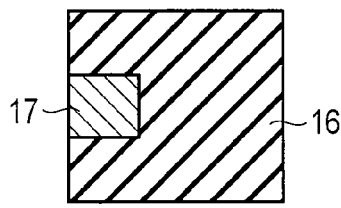
Figure 2D:
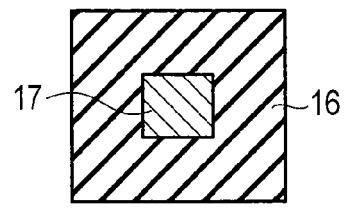

In FIG. 2A, for none of the four sides of the rectangular conductive portion, the insulating portion is arranged between each of these sides of the conductive portion and a corresponding one of the four sides of the device region; FIG. 2A shows a conventional example. In FIG. 2B, for two of the four sides of the rectangular conductive portion, the insulating portion is arranged between each of these sides of the conductive portion and a corresponding one of the four sides of the device region is two; FIG. 2B shows a comparative example. In FIG. 2C, for three of the four sides of the rectangular conductive portion, the insulating portion is arranged between each of these sides of the conductive portion and a corresponding one of the four side of the device region is three; FIG. 2C shows an embodiment. In FIG. 2D, for all of the four sides of the rectangular conductive portion, the insulating portion is arranged between each of these sides of the conductive portion and a corresponding one of the four sides of the device region is four; FIG. 2D shows another embodiment.

Figure 3:
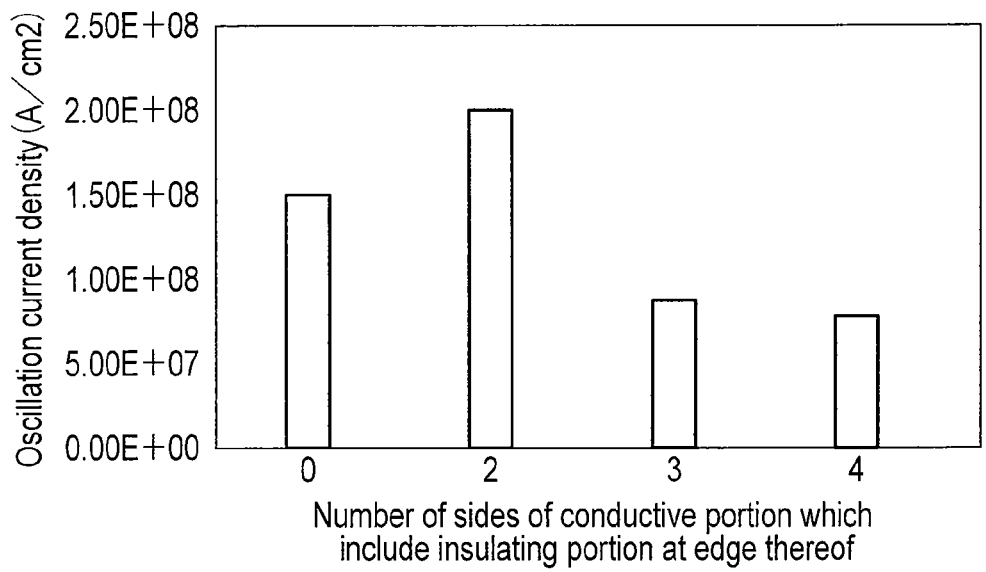
FIG. 3 is a graph illustrating the relationship between a current density required for oscillation and the number of sides of the conductive portion for which the insulating portion is arranged between each of these sides of the conductive portion and a corresponding one of the four sides of the device region.

FIG. 3 is a graph illustrating the relationship between a current density required for oscillation and the number of those of the four sides of the rectangular conductive portion for which the insulating portion is arranged between each of these sides of the conductive portion and a corresponding one of the four sides of the device region (the numbers in FIG. 3 correspond to FIGS. 2A to 2D). FIG. 3 shows the results of determination, through simulation, of a drive current required for oscillation with the size of the device region set to 50 nm×50 nm and with the arrangement of the conductive portion of the current confinement layer with respect to the device region varied.

FIG. 3 indicates that the drive current can be reduced by increasing the number of those of the four sides of the rectangular conductive portion for which the insulating portion is arranged between each of these sides of the conductive portion and a corresponding one of the four sides of the device region, that is, the drive current can be reduced by arranging the conductive portion, corresponding to a drive current path, closer to a central portion of the device region.

When the spin torque oscillator is oscillated at a high frequency, saturation of an oscillation state starts from the central portion of the oscillation layer. Thus, even with a low drive current, the oscillation state of the central portion of the oscillation layer can be promoted by arranging the drive current path in the central portion of the oscillation layer.

Figure 4:
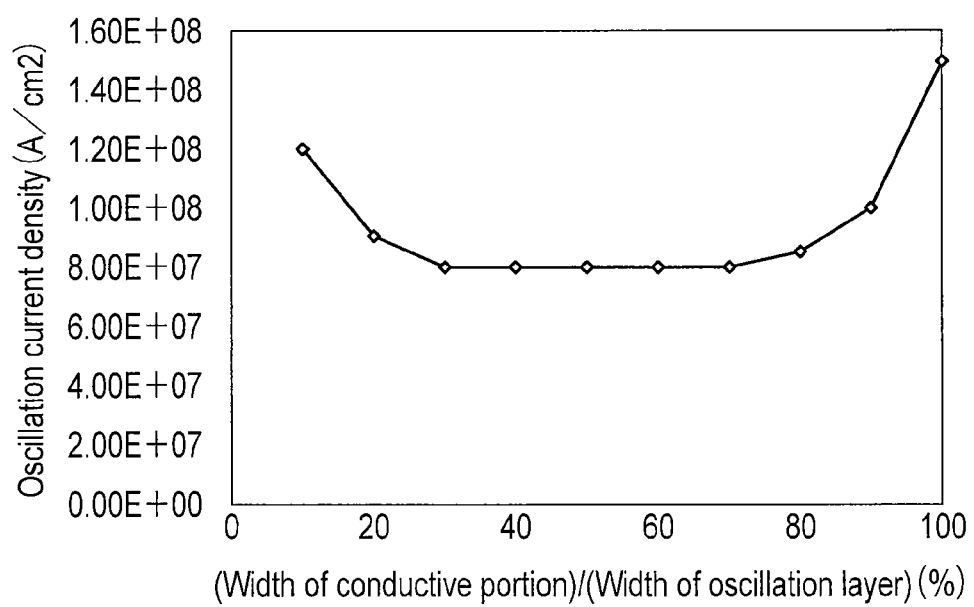
FIG. 4 is a diagram illustrating the relationship between the current density required for oscillation and the ratio of the width of the conductive portion of the current confinement layer to the width of an oscillation layer.

FIG. 4 is a diagram illustrating the relationship between the current density required for oscillation and the ratio of the width of the conductive portion of the current confinement layer to the width of the oscillation layer which relationship is observed when the conductive portion of the current confinement layer is located in the central portion of the device region (which is 50 nm×50 nm in size), i.e., the case corresponding to FIG. 2D. FIG. 4 indicates that the width of the conductive portion of the current confinement layer is preferably 20% or more and 90% or less of the width of the oscillation layer. When the width of the conductive portion is larger than 90% of the width of the oscillation layer, the effect of reducing the oscillation current density is hard to be exerted. When the width of the conductive portion is smaller than 20% of the width of the oscillation layer, oscillation occurs in the spin injection layer and is thus unlikely to occur in the oscillation layer. Thus, the effect of reducing the oscillation current density is hard to be exerted.

The current confinement layer may be arranged as a non-magnetic layer other than the spin injection layer and oscillation layer, which are magnetic layers, and may be arranged as one of the topmost surface layer (cap layer), intermediate layer, and underlayer of the spin torque oscillator or as a plurality of these layers. However, the current confinement layer is preferably arranged as the topmost surface layer of the spin torque oscillator. For the spin torque oscillator with the current confinement layer provided as the topmost surface layer, the impact, on the crystal structure, of the spin injection layer and oscillation layer, which are magnetic layers, is negligible. Furthermore, when a protect layer is provided between the oscillation layer and the current confinement layer, oxygen or nitrogen present in the insulating portion of the current confinement layer can be restrained from diffusing to the oscillation layer.

[Method of Manufacturing a Spin Torque Oscillator]

FIGS. 5A to 5F are cross-sectional views illustrating an example of a method of manufacturing a spin torque oscillator according to the embodiment.

Figure 5A:
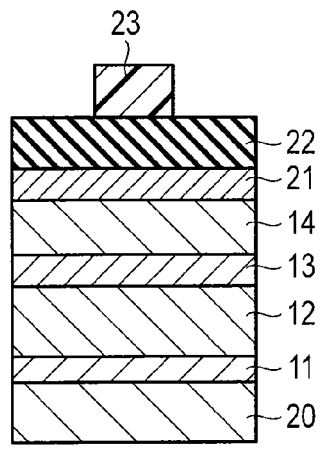
FIGS. 5A, 5B, 5C, 5D, 5E and 5F are cross-sectional views illustrating an example of a method of manufacturing a spin torque oscillator according to the embodiment.

As shown in FIG. 5A, for example, the following layers are deposited on the main pole 20: an underlayer 11, a spin injection layer 12, an intermediate layer 13, an oscillation layer 14, a metal layer 21 to be converted into a current confinement layer, and a hard mask layer 22. A resist is applied to the hard mask layer 22, and then a resist pattern 23 of a predetermined geometry is formed. The resist pattern 23 can be formed using a stepper. However, the resist pattern 23 may be formed by writing with an electron beam or nanoimprinting.

Figure 5B:
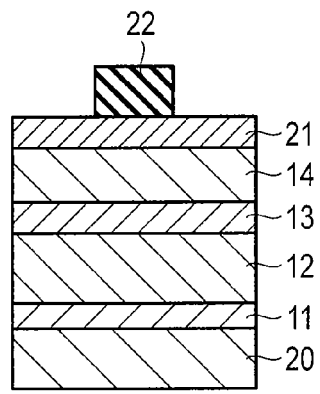

As shown in FIG. 5B, the resist pattern 23 is transferred to the hard mask layer 22 using reactive ion etching (RIE).

The resist pattern 23 may be used as an ion milling mask without any change. However, when the pattern size is reduced to increase the aspect ratio of the resist pattern 23, collapse of the pattern may occur. To avoid this, the resist pattern 23 needs to be reduced in height. However, the reduced height of the resist pattern 23 makes processing of the spin torque oscillator by ion milling difficult. Thus, the resistance, to ion milling, of the hard mask layer 22 to which the pattern is transferred needs to be increased with decreasing device size of the spin torque oscillator.

Examples of the hard mask layer 22 include carbon (C), Si, Ta, Ti, and $Al_2O_3$. However, the hard mask layer 22 is not particularly limited provided that the hard mask layer 22 resists ion milling. If for example, carbon is used as the hard mask layer 22, the hard mask layer 22 is etched by oxygen RIE. Furthermore, a second hard mask layer comprising Si, for example, may be provided between the resist and the hard mask layer 22 formed of carbon. The second hard mask layer formed of Si etc. can be etched using halogen gas and appropriately resists etching based on oxygen RIE. Thus, the second hard mask layer serves to improve etching selectivity to resist and carbon.

Figure 5C:
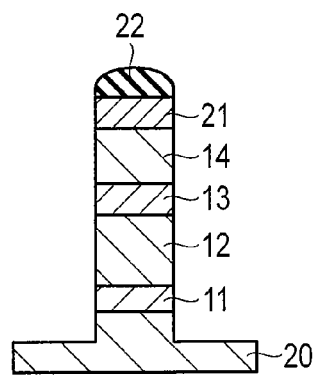

As shown in FIG. 5C, the metal layer 21, the oscillation layer 14, the intermediate layer 13, the spin injection layer 12, and the underlayer 11 are removed from regions exposed from the pattern of the hard mask layer 22 by ion milling. Moreover, the film thickness of the main pole 20 is partly reduced. At this time, redeposition and a taper angle can be controlled by controlling the height of the hard mask layer 22 and an ion milling angle. The ion milling angle is between the film surface of the hard mask layer 22 and an ion irradiation direction. As described below, the pattern of the hard mask layer 22 can be shaped like a barrel roof or a trapezoid with tapered surfaces at ends thereof.

FIG. 6 illustrates the dependence of the milling rate of carbon on the ion milling angle. As shown in FIG. 6, the milling rate of carbon is greatest at an ion milling rate of about 50 degrees.

When milling is carried out with the ion milling angle set to 0 degree, that is, with ions emitted perpendicularly to the film surface, corners of the pattern of the hard mask layer 22 are removed. Thus, tapered surfaces inclined at about 50 degrees to the upper film surface are formed at the respective ends of the hard mask layer 22. When the milling is continued with the ion milling angle kept at 0 degree, the tapered surfaces at the respective ends of the hard mask layer 22 are milled at an ion milling angle of about 50 degrees. At this time, the milling rate of carbon is high at the tapered surfaces, allowing the pattern of the hard mask layer 22 to be shaped like a barrel roof or a trapezoid with the tapered surfaces at the ends thereof.

FIG. 7 illustrates the dependence, on the ion milling angle, of the ratio of the pattern width to the mask width obtained after the ion milling. Setting the ion milling angle to smaller than 50 degrees causes redeposition, increasing the ratio of the pattern width to the mask width. Setting the ion milling angle to greater than 50 degrees, for example, 80 degrees, causes side etching, reducing the ratio of the pattern width to the mask width.

Thus, first, the ion milling angle is set to about 50 degrees. The metal layer 21, the oscillation layer 14, the intermediate layer 13, the spin injection layer 12, the underlayer 11, and a part of the main pole 20 are removed at a high milling rate. A mask shape is then transferred. Thereafter, the ion milling angle is set to 0 degrees. The pattern of the hard mask layer 22 is shaped to include tapered surfaces at the ends thereof. Then, the ion milling angle is set to about 80 degrees to prevent redeposition. Hence, the pattern of the hard mask layer 22 can be formed to have the desired shape.

Figure 5D:
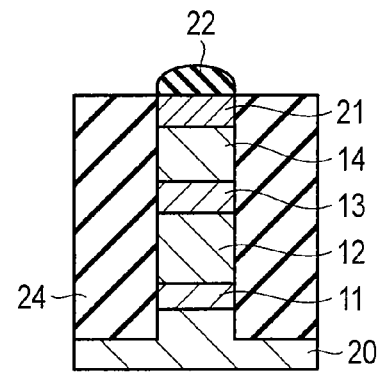

As shown in FIG. 5D, a buried insulating layer 24 is deposited on the sides of the underlayer 11, spin injection layer 12, intermediate layer 13, and oscillation layer 14 on the main pole 20. Examples of a material for the buried insulating layer 24 generally include $SiO_2$ and $Al_2O_3$. However, the material is not particularly limited. Moreover, the buried insulating layer 24 is etched back by RIE or ion milling so as to expose the pattern of the hard mask layer 22. Burying the insulating layer allows the side walls of the layers other than the metal layer 21, formed in the topmost surface of the spin torque oscillator, to be restrained from being oxidized (nitrided).

Figure 5E:
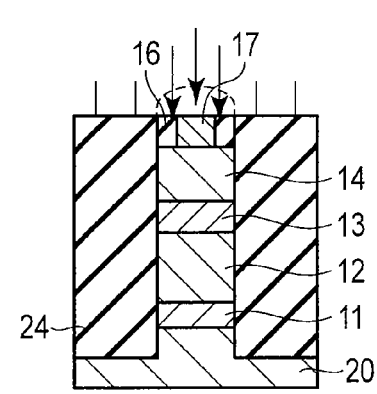

As shown in FIG. 5E, the hard mask layer is removed by RIE using oxygen gas to convert the metal layer 21 into a current confinement layer 15 with an insulating layer 16 and a conductive portion 17 formed of a nonmagnetic metal and penetrating the insulating portion 16 in the direction of stacking. That is, the insulating portion 16 can be formed for the following reason. In the pattern of the hard mask layer 22, the tapered portions located at the ends of the hard mask layer 22 is removed first because of the small thickness thereof, and only the ends of the metal layer 21, located under the tapered portions of the hard mask layer 22, is oxidized. Incidentally, before the removal of the pattern of the hard mask layer 22, the ion implantation may be used to implant oxygen ions or nitride ions into the ends of the metal layer 21 to produce the insulating portion 16.

In the ion milling method, etching is carried out with an acceleration voltage set to about several hundred volts. However, in the ion implantation method, ions can be implanted with the acceleration voltage set to several kilovolts to several tens of kilovolts without etching. Here, since the pattern of the hard mask layer 22 is shaped like a barrel roof, oxygen ions or nitrogen ions can be implanted deeper through the ends of the pattern of the hard mask layer 22, which are small in film thickness.

Furthermore, either method may result in formation of a thin insulating film (oxide film or nitride film) on the surface of the conductive portion. Thus, after the removal of the hard mask layer, ion milling or bias sputter etching may be carried out to remove the current confinement layer 15 by about 3 to 10 nm. Such treatment allows removal of the insulating film formed in the conductive portion 17 of the current confinement layer 15. At this time, the range of the insulating portion can be adjusted by, for example, regulating an ion milling rate.

Figure 5F:
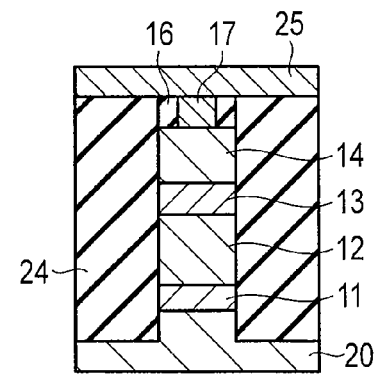

As shown in FIG. 5F, a shield 25 formed of NiFe, for example, is deposited on the current confinement layer 15 and the buried insulating layer 24. As described above, the spin torque oscillator 10 with the current confinement layer 15 in the topmost surface can be manufactured.

EXAMPLES

Example 1

A spin torque oscillator was manufactured using the method illustrated in FIGS. 5A to 5F.

Ru, CoCrPt, Cu, FeCoAl, Ti, Si, and carbon (C) were deposited on the main pole 20. Ru was deposited to a thickness of 15 nm and served as an underlayer 11. CoCrPt was deposited to a thickness of 20 nm and served as a spin injection layer 12. Cu was deposited to a thickness of 3 nm and served as an intermediate layer 13. FeCoAl was deposited to a thickness of 13 nm and served as an oscillation layer 14. Ti was deposited to a thickness of 20 nm and served as a metal layer 21 to be converted into the current confinement layer. Si was deposited to a thickness of 5 nm and served as a hard mask layer 22. Carbon (C) was deposited to a thickness of 70 nm. Then, a resist was applied to the hard mask layer 22, and thereafter a resist pattern 23 of a predetermined geometry was formed. Ion milling was carried out so as to set the device size to 50 nm×50 nm. The metal layer 21 formed of Ti was converted into a current confinement layer 15 by RIE using oxygen gas. The current confinement layer 15 was etched by 3 nm by means of bias sputtering. Thereafter, a shield 25 was deposited on the current confinement layer 15. Thus, a spin torque oscillator was manufactured.

The width of the insulating portion 16 was measured by energy dispersive X-ray diffraction (EDX). The results of the measurement indicate that the insulating portion 16 was present down to a depth of about 3 nm (oxygen advanced to a depth of 6 nm including the portion removed by etching) and that the depth corresponded to 50% of the width of the oscillation layer 14.

When the spin torque oscillator was driven, oscillation at 25 GHz was observed in the oscillation layer 14. The high-frequency power was $2.0 \times 10^{-18}$ $V^2$/Hz, and the oscillation current density was $8.1 \times 10^7$ A/cm$^2$.

Example 2

As is the case with Example 1, an underlayer 11, a spin injection layer 12, an intermediate layer 13, an oscillation layer 14, a metal layer 21, and a hard mask layer 22 were deposited on the main pole 20. A resist pattern 23 was then was formed. Ion milling was carried out so as to set the device size to 50 nm×50 nm. The metal layer 21 formed of Ti was converted into a current confinement layer 15 by implanting oxygen ions through the pattern of the hard mask layer 22. The current confinement layer 15 was etched by 6 nm by means of bias sputtering. Thereafter, a shield 25 was deposited on the current confinement layer 15. Thus, a spin torque oscillator was manufactured. According to Example 1, by etching the current confinement layer 15 by about 6 nm, an oxide film formed during removal of the hard mask layer would be all removed. Hence, the remaining insulating portion 16 was formed by implantation of oxygen ions.

The width of the insulating portion 16 was measured by EDX. The results of the measurement indicate that the insulating portion 16 was present down to a depth of about 7 nm and that the depth corresponded to 50% of the width of the oscillation layer 14.

When this spin torque oscillator was driven, oscillation at 25 GHz was observed in the oscillation layer 14. The high-frequency power was $2.0 \times 10^{-18}$ $V^2$/Hz, and the oscillation current density was $7.8 \times 10^7$ A/cm$^2$.

Example 3

As is the case with Example 1, an underlayer 11, a spin injection layer 12, an intermediate layer 13, an oscillation layer 14, a metal layer 21, and a hard mask layer 22 were deposited on the main pole 20. A resist pattern 23 was then formed. Ion milling was carried out so as to set the device size to 50 nm×50 nm. The metal layer 21 formed of Ti was converted into a current confinement layer 15 by implanting oxygen ions through the pattern of the hard mask layer 22. The current confinement layer 15 was etched by 6 nm by means of bias sputtering. Thereafter, a shield 25 was deposited on the current confinement layer 15. Thus, a spin torque oscillator was manufactured. According to Example 1, by etching the current confinement layer 15 by about 6 nm, the oxide film formed during removal of the hard mask layer would be all removed. Hence, the remaining insulating portion 16 was formed by implantation of oxygen ions.

The width of the insulating portion 16 was measured by EDX. The results of the measurement indicate that the insulating portion 16 was present down to a depth of about 7 nm and that the depth corresponded to 50% of the width of the oscillation layer 14.

When the spin torque oscillator was driven, oscillation at 25 GHz was observed in the oscillation layer 14. The high-frequency power was $2.0 \times 10^{-18}$ V$^2$/Hz, and the oscillation current density was $8.3 \times 10^7$ A/cm$^2$.

Comparative Example 1

A spin torque oscillator was manufactured in the same manner as that in Example 1 except that the current confinement layer 15 was etched by 6 nm by means of bias sputtering before the shield was deposited. According to Example 1, by etching the current confinement layer 15 by 6 nm, the oxide film formed during removal of the hard mask layer was all removed.

EDX was used to determine that no current confinement layer was present into which the metal layer formed of Ti was converted but that only the Ti conductive portion was present.

When the spin torque oscillator was driven, oscillation at 25 GHz was observed in the oscillation layer 14. The high-frequency power was $2.0 \times 10^{-18}$ V$^2$/Hz. This indicates that the high-frequency power in Comparative Example 1 was not lower than that in the examples. Furthermore, the oscillation current density was $1.7 \times 10^8$ A/cm$^2$. This indicates that the spin torque oscillators in Examples 1 to 3 each of which included the current confinement layer were lower than that in Comparative Example 1 in oscillation current density.

Table 1 shows the oscillation current density and high-frequency power in Examples 1 to 3 and Comparative Example 1.

TABLE 1

|  | Oscillation current density (A/cm$^2$) | High-frequency power (V$^2$/Hz) |
| --- | --- | --- |
| Example 1 | 8.1E+07 | 2.00E−18 |
| Example 2 | 7.8E+07 | 2.00E−18 |
| Example 3 | 8.3E+07 | 2.00E−18 |
| Comparative Example 1 | 1.7E+08 | 2.00E−18 |

Now, a magnetic head assembly and a magnetic recording apparatus (HDD) both using the above-described spin torque oscillator will be described.

Figure 8:
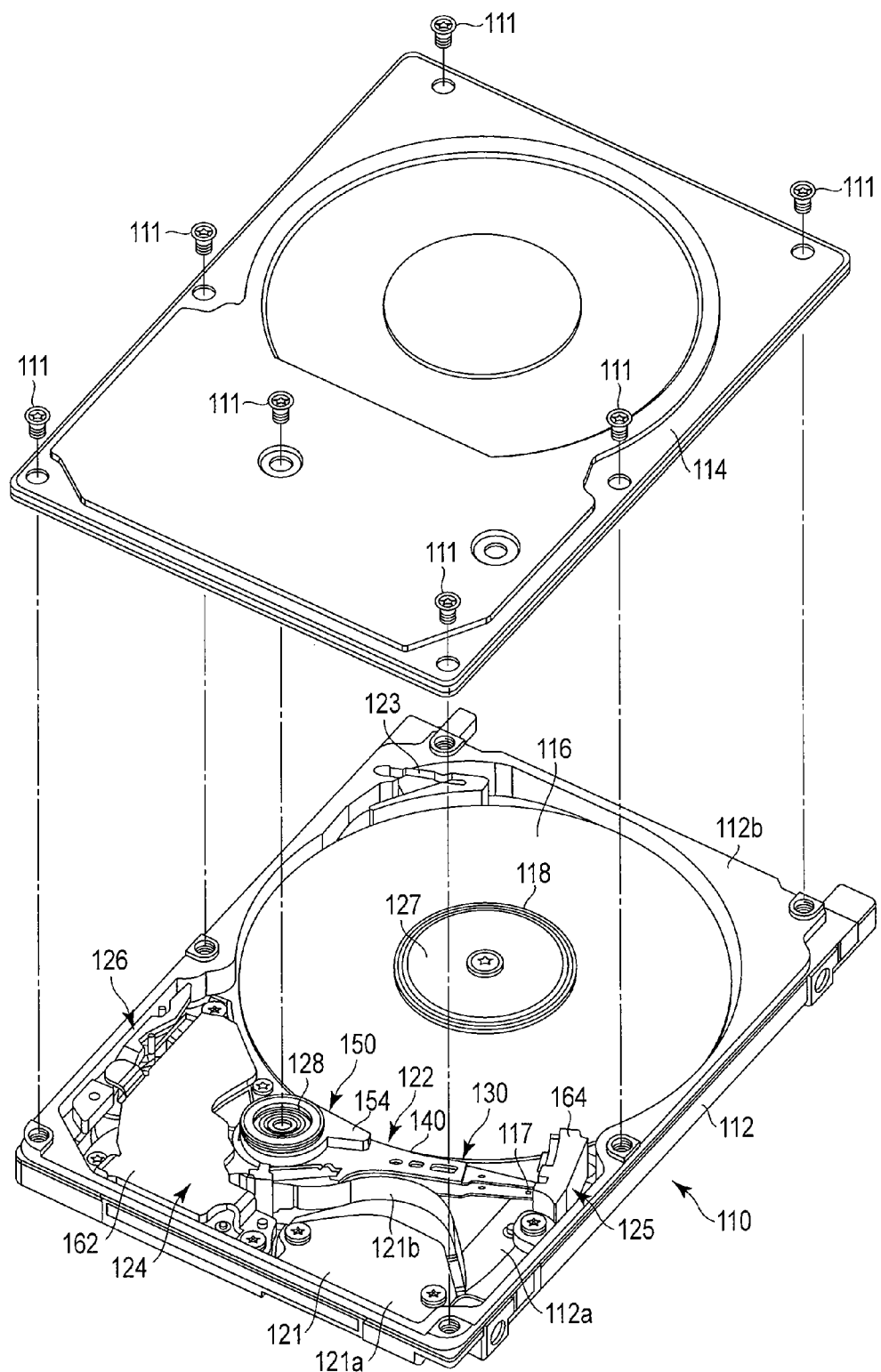
FIG. 8 is a perspective view showing the internal structure of a magnetic recording apparatus (HDD) according to an embodiment.

FIG. 8 is a perspective view showing the internal structure of a magnetic recording apparatus (HDD) according to the embodiment. As shown in FIG. 8, HDD comprising a housing 110. The housing 110 includes a base 112 shaped like a rectangular box with an open top surface, and a top cover 114 locked to the base with screws 111 to close the opening at the upper end of the base. The base 112 includes a rectangular bottom wall 112a and a side wall 112b provided upright along the periphery of the bottom wall.

One magnetic disk 116 and a spindle motor 118 are provided inside the housing 110; the magnetic disk 116 serves as a recording medium, and the spindle motor 118 serves as a driving section configured to support and rotate the magnetic disk. The spindle motor 118 is disposed on the bottom wall 112a. The housing 110 is formed to have a size enough to accommodate a plurality of magnetic disks, for example, two magnetic disks. The spindle motor 118 is formed to be able to support and drive two magnetic disks.

A plurality of magnetic heads 117, a head stack assembly (hereinafter referred to as HSA) 122, a voice coil motor (hereinafter referred to as VCM) 124, a lamp load mechanism 125, a latch mechanism 126, and a substrate unit 121 are housed in the housing 110. The magnetic heads 117 record and reproduce information on and from the magnetic disk 116. HAS 122 movably supports the magnetic heads over the magnetic disk 116. VCM 124 pivotally moves and positions HSA. The lamp load mechanism 125 holds HSA in a retracted position where the magnetic disk is separate from the magnetic disk when the magnetic head has moved to the outermost periphery of the magnetic disk. The latch mechanism 126 holds HSA in a retracted position when an impact or the like acts on HDD. The substrate unit 121 includes a preamplifier. A print circuit board (not shown in the drawings) is screwed to an outer surface of a bottom wall 112a of the base 112. The print circuit board controls the operation of the spindle motor 118, VCM 124, and the magnetic heads via the substrate unit 121. A circulation filter 123 is provided in the side wall of the base 112 to catch dust generated inside the housing as a result of operation of the movable section. The circulation filter 123 is positioned outside the magnetic disk 116.

The magnetic disk 116 is formed, for example, to have a diameter of 65 mm (2.5 inches) and includes a magnetic recording layer in both the top and bottom surfaces thereof. The magnetic disk 116 is coaxially fitted around a hub (not shown in the drawings) of the spindle motor 118, and is fixedly clamped to the hub by a clamp spring 127. Thus, the magnetic disk 116 is supported parallel to the bottom wall 112a of the base 112. The magnetic disk 116 is rotated at a predetermined speed, for example, at 5,400 rpm or 7,200 rpm, by the spindle motor 118.

Figure 9:
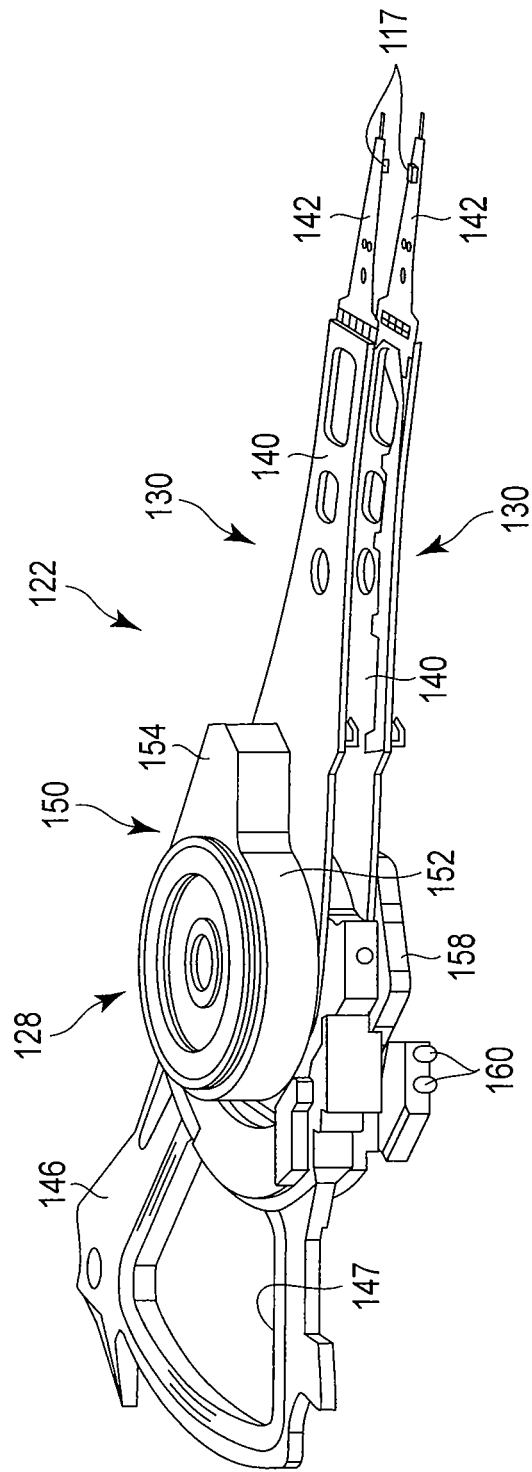
FIG. 9 is a perspective view showing a head stack assembly.
Figure 10:
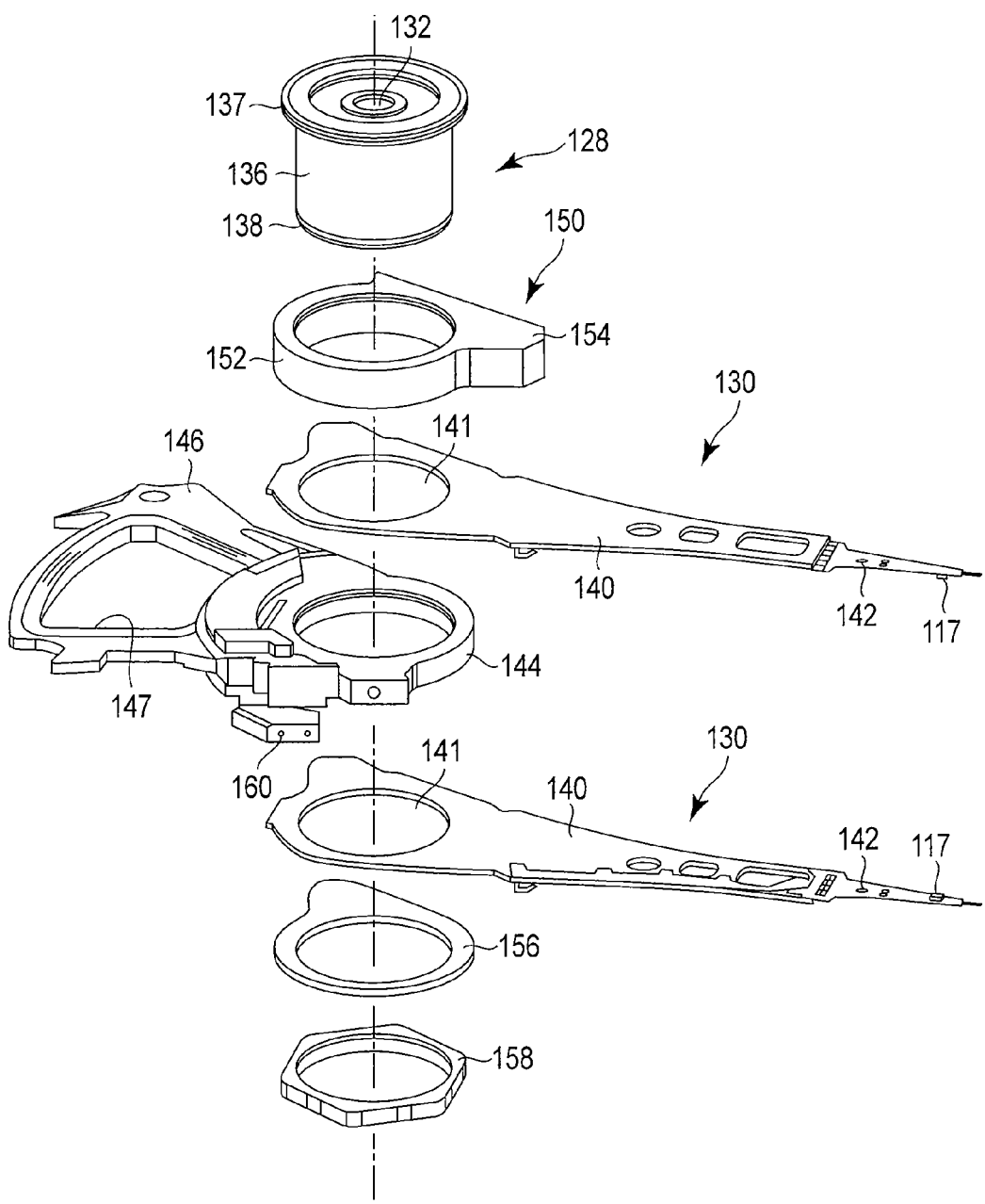
FIG. 10 is an exploded perspective view showing the head stack assembly.

FIG. 9 is a perspective view showing the head stack assembly (HSA) 122 according to the embodiment. FIG. 10 is an exploded perspective view. As shown in FIG. 9 and FIG. 10, HSA 122 comprises a bearing portion 128, two head gimbal assembly (hereinafter referred to as HGA) 130 extending from the bearing portion, a spacer ring 144 arranged between HGAs in a stacked manner, and a dummy spacer 150.

The bearing portion 128 is positioned away from the center of rotation of the magnetic disk 116 along a longitudinal direction of the base 112. The bearing portion 128 includes a pivot shaft 132 provided upright on the bottom wall 112a of the base 112 and a cylindrical sleeve 136 supported coaxially with the pivotal shaft 132 so as to be rotatable via a bearing 134. The sleeve 136 includes an annular flange 137 formed at an upper end of the sleeve 136 and a threaded portion 138 formed on the outer periphery of a lower end thereof. The sleeve 136 of the bearing portion 128 is formed to have a size, in this case, a mountable axial length enough to allow a maximum number of HGAs, for example, four HGAs and spacers each positioned between two adjacent HGAs to be mounted on the sleeve 136 in a stacked manner.

In the embodiment, since the number of magnetic disks 116 is set to one, two HGAs 130, the number of which is smaller than the mountable maximum number of four, are provided on the bearing portion 128. Each HGA includes an arm 140 extending from the bearing portion 128, a suspension 142 extending from the arm, and the magnetic head 117 supported at an extension end of the suspension via a gimbal portion.

The arm 140 is formed like a thin flat plate by stacking stainless steel, aluminum, and stainless steel. The arm 140 includes a circular through-hole 141 formed at one end, that is, a base end thereof. The suspension 142 is formed by an elongate leaf spring with a base end thereof fixed to a leading end of the arm 140 by spot welding or bonding. The suspension 142 extends from the arm. The suspension 142 and the arm 140 may be integrally formed of the same material.

The magnetic head 117 includes a substantially rectangular slider (not shown in the drawings), and a recording head and a reproducing CPP-GMR head according to the embodiment both formed on the slider. The magnetic head 117 is fixed to the gimbal portion formed at the leading end of the suspension 142. Furthermore, the magnetic head 117 includes four electrodes (not shown in the drawings). A relay flexible print circuit board (hereinafter referred to as the relay FPC; not shown in the drawings) is installed on the arm 140 and the suspension 142. The magnetic head 117 is electrically connected to a main FPC 121b via the relay FPC.

The spacer ring 144 is formed of aluminum or the like so as to have a predetermined thickness and a predetermined outer diameter. A support frame 146 comprising a synthetic resin is integrally formed on the spacer ring 144. The support frame 146 extends outward from the spacer ring. A voice coil 147 of VCM 124 is fixed to the support frame 146.

The dummy spacer 150 includes an annular spacer main body 152 and a balance adjustment section 154 extending from the spacer main body. The dummy spacer 150 is formed, for example, integrally with metal such as stainless steel. The spacer main body 152 is formed to have an outer diameter equal to that of the spacer ring 144. That is, a portion of the spacer main body 152 which is contacted by the arm is formed to have an outer diameter equal to that of a portion of the spacer ring 144 which is contacted by the arm. Furthermore, the spacer main body 152 is formed to have a thickness equal to the sum of the thickness of the arms of less than the maximum number of HGAs, in this case, two HGAs, that is, the thickness corresponding to the two arms, and the thickness of the spacer ring arranged between the arms.

The dummy spacer 150, the two HGAs 130, and the spacer ring 144 are fitted around the outer periphery of the sleeve 136 of the bearing portion 128 so that the sleeve 136 of the bearing portion 128 is inserted through an inner hole in the spacer main body 152, the through-hole 141 in the arm 140, and an inner hole in the spacer ring. The dummy spacer 150, the two HGAs 130, and the spacer ring 144 are arranged on the flange 137 along the axial direction of the sleeve in a stacked manner. The spacer main body 152 of the dummy spacer 150 is fitted around the outer periphery of the sleeve 136 so as to be sandwiched between the flange 137 and one of the arms 140. The spacer ring 144 is fitted around the outer periphery of the sleeve 136 so as to be sandwiched between the two arms 140. Moreover, an annular washer 156 is fitted around the outer periphery of the lower end sleeve 136.

The dummy spacer 150, two arms 140, spacer ring 144, and washer 156 all fitted around the outer periphery of the sleeve 136 are sandwiched between the flange 137 and a nut 158 screwed to the threaded portion 138 of the sleeve 136. The dummy spacer 150, two arms 140, spacer ring 144, and washer 156 are thus fixedly held on the outer periphery of the sleeve 136.

The two arms 140 are placed at predetermined positions with respect to a circumferential direction of the sleeve 136. The two arms 140 extend in the same direction from the sleeve. Thus, the two HGAs can move pivotally integrally with the sleeve 136 and are located opposite each other at a predetermined distance from the respective surfaces of the magnetic disk 116. Furthermore, the support frame 146 integrated with the spacer ring 144 extends from the bearing portion 128 in a direction opposite to that in which the arms 140 extend. Two pin-shaped terminals 160 projects from the support frame 146. The terminals are electrically connected to the voice coil 147 via wiring (not shown in the drawings) embedded in the support frame 146.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A spin torque oscillator comprising:
   an oscillation layer comprising a magnetic material;
   a spin injection layer comprising a magnetic material and configured to inject a spin into the oscillation layer; and
   a current confinement layer consisting of an insulating portion comprising an oxide or a nitride and a single conductive portion comprising a nonmagnetic metal and penetrating the insulating portion in a direction of stacking,
   wherein the conductive portion of the current confinement layer has a rectangular planar shape, and a device region including the oscillation layer and the spin injection layer has a rectangular planar shape in a size of 50 nm×50 nm or less, and
   wherein the conductive portion of the current confinement layer is positioned near a central portion of a plane of the device region including the oscillation layer and the spin injection layer, and the insulating portion is between each of three sides of the conductive portion and a corresponding one of four sides of the device region, and a fourth side of the conductive portion is at one of the four sides of the device region without the insulating portion being between the fourth side of the conductive region and the one of the four sides of the device region.

2. The spin torque oscillator of claim 1, wherein the conductive portion of the current confinement layer is 20% or more and 90% or less of the oscillation layer in width.

3. The spin torque oscillator of claim 1, wherein the current confinement layer is positioned above the oscillation layer and the spin injection layer in the direction of stacking.

4. A magnetic recording head comprising the spin torque oscillator of claim 1, and a main pole.

5. A magnetic head assembly comprising:
   the magnetic recording head of claim 4;
   a head slider with the magnetic recording head mounted thereon;
   a suspension configured to hold the head slider at one end thereof; and
   an actuator arm connected to another end of the suspension.

6. A magnetic recording apparatus comprising:
   a magnetic recording medium;
   a magnetic head assembly of claim 5; and
   a signal processing section configured to write and read a signal to and from the magnetic recording medium using the magnetic recording head mounted in the magnetic head assembly.

7. The magnetic recording apparatus of claim 6, wherein the spin torque oscillator is provided on a trailing side of the main pole.

8. The magnetic recording apparatus of claim 6, wherein the spin torque oscillator is provided on a leading side of the main pole.

9. The spin torque oscillator of claim 1, wherein the single conductive portion is directly contacting the oscillation layer.

* * * * *